United States Patent [19]

Inaba et al.

[11] Patent Number: 5,629,043

[45] Date of Patent: May 13, 1997

[54] SILICON NITRIDE FILM FORMATION METHOD

[75] Inventors: Yutaka Inaba; Kiyoteru Kobayashi, both of Hyogo, Japan

[73] Assignee: Mitsubishi Denki Kabushiki Kaisha, Tokyo, Japan

[21] Appl. No.: 526,900

[22] Filed: Sep. 12, 1995

[30] Foreign Application Priority Data

Dec. 15, 1994 [JP] Japan ................................ 6-311478

[51] Int. Cl.$^6$ ................................................ C23C 16/34
[52] U.S. Cl. ........................ 427/79; 427/81; 427/126.2; 427/255; 427/255.2; 427/255.7
[58] Field of Search ........................ 427/79, 81, 126.2, 427/255, 255.2, 255.7

[56] References Cited

U.S. PATENT DOCUMENTS

| | | | |
|---|---|---|---|
| 4,871,416 | 10/1989 | Fukuda | 156/635 |
| 4,931,897 | 6/1990 | Tsukamoto et al. | 361/313 |
| 5,129,958 | 7/1992 | Nagashima et al. | 134/22.1 |
| 5,298,287 | 3/1994 | Veltri | 427/255.2 |
| 5,482,739 | 1/1996 | Hey et al. | 427/255.2 |

*Primary Examiner*—Benjamin Utech
*Assistant Examiner*—Timothy H. Meeks
*Attorney, Agent, or Firm*—Oblon, Spivak, McClelland, Maier & Neustadt, P.C.

[57] ABSTRACT

In the formation of a silicon nitride film, dichlorosilane and ammonia are used as source gas and, for example, argon is used as carrier gas. The pressure (total pressure) inside a chamber is set to about 100 to 300 Torr ($1.33\times10^4$ to $4.00\times10^4$ Pa). The desirable setting is that, for example, dichlorosilane is 60 SCCM, ammonia is 300 SCCM and hydrogen is 20 SLM. When the silicon nitride film is formed under such conditions, improvement in a masking effect of the silicon nitride film for preventing oxidation can be achieved.

13 Claims, 8 Drawing Sheets

SILICON NITRIDE FILM FORMATION METHOD

BACKGROUND OF THE INVENTION

1. Field of the Invention

The present invention relates to a method of and an apparatus for manufacturing a semiconductor device, and more particularly to a method of and an apparatus for manufacturing a semiconductor device which is suitable for a dynamic RAM having a stacked capacitor.

2. Description of the Background Art

In the art of dynamic RAM, as capacitor region and electric charges accumulated therein decrease with refinement of a circuit, degradation of reliability due to software error and the like becomes pronounced. As a solution therefor, a variety of capacitors having three-dimensional structure are put forth. Among them, a so-called stacked capacitor is the most widely used capacitor.

FIG. 7 is a sectional view of a structure of stacked capacitor cell. A pair of source-drain diffusion layers 5 are disposed in an active region which is an upper portion of a silicon substrate 1 isolated by a field oxide film 2. A gate electrode 3 of polysilicon is formed above a portion of the silicon substrate 1 between the source-drain diffusion layers 5. Between the gate electrode 3 and the silicon substrate 1, disposed is a gate oxide film 13. The gate oxide film 13, the source-drain diffusion layers 5 and the gate electrode 3 constitute a switching transistor.

One of the source-drain diffusion layers 5 is connected to a capacitor accumulation electrode 8 of polysilicon, and the electric charges are fed therefrom to a capacitor 100 through the switching transistor. The capacitor accumulation electrode 8 is insulated by the other of the source-drain diffusion layers 5, the gate electrode 3 and an interlayer oxide film 6.

The capacitor 100 includes the capacitor accumulation electrode 8 and a silicon nitride film 9, a silicon oxide film 10 and a capacitor counter electrode 11 which are stacked on the capacitor accumulation electrode 8 in this order. The silicon nitride film 9 and the silicon oxide film 10 serve as a capacitor dielectric film. The stacked structure, in which the silicon oxide film 10 is formed over the silicon nitride film 9, suppresses a leak current of the capacitor 100 and ensures a long lifetime.

At first, the silicon nitride film 9 is formed on the interlayer oxide film 6 and the capacitor accumulation electrode 8 by a low pressure CVD (chemical vapor deposition) method. Next, the silicon nitride film 9 is oxidized in pyrogenic manner to form the silicon oxide film 10 on the surface thereof. The capacitor counter electrode 11 is made of polysilicon.

The method of forming the silicon nitride film 9 will be discussed below in more detail. FIG. 8 is a sectional view of an apparatus used for forming a silicon nitride film by a batch-type low pressure CVD method. A quartz tube 21 of hollow cylindrical construction is heated by three heaters 22 having resistance heating system, to 700° C. to 800° C. generally in forming a silicon nitride film. Metallic flanges 23 are each provided at the front of and at the back of the quartz tube 21 for support and vacuum sealing. The quartz tube 21, which is vacuum-sealed by the flanges 23, is evacuated with a vacuum pump 24, thus keeping at the degree of vacuum of 1 mTorr (0.133 Pa).

Now, the operation of forming the silicon nitride film will be discussed. About 100 sheets of silicon substrates 20 are supported on a jig 26, called a boat, of quartz, being uniformly spaced in perpendicular to this page. The boat 26 for supporting the silicon substrates 20 is inserted into the quartz tube 21 in the atmosphere and the flanges 23 close the quartz tube 21. Next, the quartz tube 21 is evacuated by activation of a vacuum pump 24. After the silicon substrates 20 are sufficiently heated to a prescribed temperature, dichlorosilane ($SiH_2Cl_2$) and ammonia ($NH_3$) as source gas for forming a silicon nitride film are fed into the quartz tube 21 through the left flange 23 while being flow-controlled by a mass flow controller 25. The mass flow controller 25 controls the pressure of the quartz tube 21 to 0.3 Torr (39.9 Pa) in general.

The gas flows of dichlorosilane and ammonia are generally about 30 SCCM and 180 SCCM, respectively. The volume flow rate of ammonia to dichlorosilane is in the range of 4 to 10, which is disclosed in Japanese Patent Application Laid-Open Gazette 6-120157.

Under this condition, the silicon nitride film is deposited on the silicon substrates 20 by the low pressure chemical vapor deposition method. After that, the gas in the quartz tube 21 is replaced with the nitrogen gas and the pressure inside the quartz tube 21 recovers to the atmospheric pressure. The boat 26 for supporting the silicon substrates 20 is taken out from the quartz tube 21 in the atmosphere. The formation of the silicon nitride film carried out as above ensures uniform thickness and reproducibility of the silicon nitride film.

In the background-art semiconductor device, an increase in the amount of charges accumulated in a capacitor has been achieved by use of stacked capacitor and the like. With further refinement, however, it is difficult to ensure the increase in the amount of accumulated charges only by use of the stacked capacitor structure. Then, for the purpose of increasing capacitance of a capacitor to ensure more amount of charges to be accumulated in the capacitor, a capacitor dielectric film is becoming thinner.

That disadvantageously causes more intense electric field to be created on the capacitor dielectric film and an increase in leak current. Furthermore, time-varying dielectric breakdown lifetime is shortened and so on. Thus, it becomes difficult to ensure reliability.

In addition, the silicon nitride film 9 is easily formed on the capacitor accumulation electrode 8, but is hard to form on the interlayer oxide film 6. Accordingly, when the capacitor dielectric film becomes thinner, the silicon nitride film 9 formed on the interlayer oxide film 6 becomes much thinner. In this case, when the silicon nitride film 9 is oxidized through pyrogenic oxidation to form the silicon oxide film 10 thereon, the oxidizing agent goes through the silicon nitride film 9 and the interlayer oxide film 6, thus oxidizing the capacitor accumulation electrode 8 of polysilicon. In short, a problem that the masking effect to prevent oxidation becomes weaker, as a silicon nitride film 9 becomes thinner.

SUMMARY OF THE INVENTION

The present invention is a directed to a method of forming a silicon nitride film by low pressure chemical vapor deposition. According to the first aspect of the present invention, the method comprises steps of (a) providing a substrate into a reaction container, (b) evacuating the reaction container, and (c) introducing a source gas including dichlorosilane and ammonia and a carrier gas to the reaction container, and setting the pressure of the reaction container to the range from 1.33 ×10⁴ to 4.00×10⁴ Pa.

Preferably, the volume flow rate of the carrier gas to the dichlorosilane is in the range from 100 to 500.

Preferably, the volume flow rate of the ammonia to the dichlorosilane is in the range from 3 to 10.

Preferably, the volume flows of the ammonia and the dichlorosilane are 300 SCCM and 60 SCCM, respectively.

Preferably, the substrate is heated to the range from 650° C. to 750° C.

Still preferably, the carrier gas includes at least one of hydrogen, nitrogen, helium and argon.

According to the second aspect of the present invention, the method of forming a silicon nitride film of the first aspect further comprises a step of (d) performing a reduction reaction on the substrate, after the step (b) before the step (c).

Preferably, the step (d) includes steps of (d-1) introducing a reducing gas for removing a natural oxide film on the substrate, and (d-2) heating the substrate.

Preferably, the reducing gas includes at least one of silane and disilane and partial pressure thereof ranges from $1.33 \times 10^{-4}$ to $1.33 \times 10^{-2}$ Pa.

Preferably, the substrate is heated to the range from 700° C. to 850° C. in the step (d-2).

Preferably, the reducing gas includes hydrogen.

Still preferably, the substrate is heated to 850° C. or more in the step (d-2).

The present invention is further directed to a method of forming a stacked capacitor comprising steps of (a) preparing a substrate having a silicon film and a silicon oxide film surrounding the silicon film in an upper portion of the substrate, (b) preparing a silicon nitride film on the silicon film and a silicon oxide film by low pressure chemical vapor deposition, (c) conducting an oxidization of a surface of the silicon nitride film to form an oxide film, and (d) providing an electrode on the oxide film, wherein the step (b) includes steps of (b-1) providing the substrate into a reaction container, (b-2) evacuating the reaction container, and (b-3) introducing a source gas including dichlorosilane and ammonia and a carrier gas to the reaction container, and setting the pressure of the reaction container to the range from $1.33 \times 10^4$ to $4.00 \times 10^4$ Pa.

According to the present invention, the conditions under which the silicon nitride film is formed by a low pressure CVD method are optimized and the quality of the formed silicon nitride film is improved.

In the formation of a silicon nitride film carried out by the method of the first aspect of the present invention, the lowest limit in film thickness of the formed silicon nitride film, required for ensuring a masking effect to prevent oxidation, can be lowered.

Thus, in accordance with the first and third aspects, when the silicon nitride film is used as a dielectric film of the stacked capacitor, an increase in capacitance of the stacked capacitor can be achieved without degradation of reliability.

In the formation of a silicon nitride film carried out by the method of the second aspect of the present invention, an oxide film is removed through a reduction reaction.

Thus, in accordance with the second and third aspects, when the silicon nitride film is used as a dielectric film and silicon is used as an electrode of the stacked capacitor, the natural oxide film on the surface of the silicon can be removed, and therefore, an increase in capacitance of the stacked capacitor can be achieved without degradation of reliability.

An object of the present invention is to provide a method of forming a silicon nitride film used for a stacked capacitor, which can be refined without degradation of reliability.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
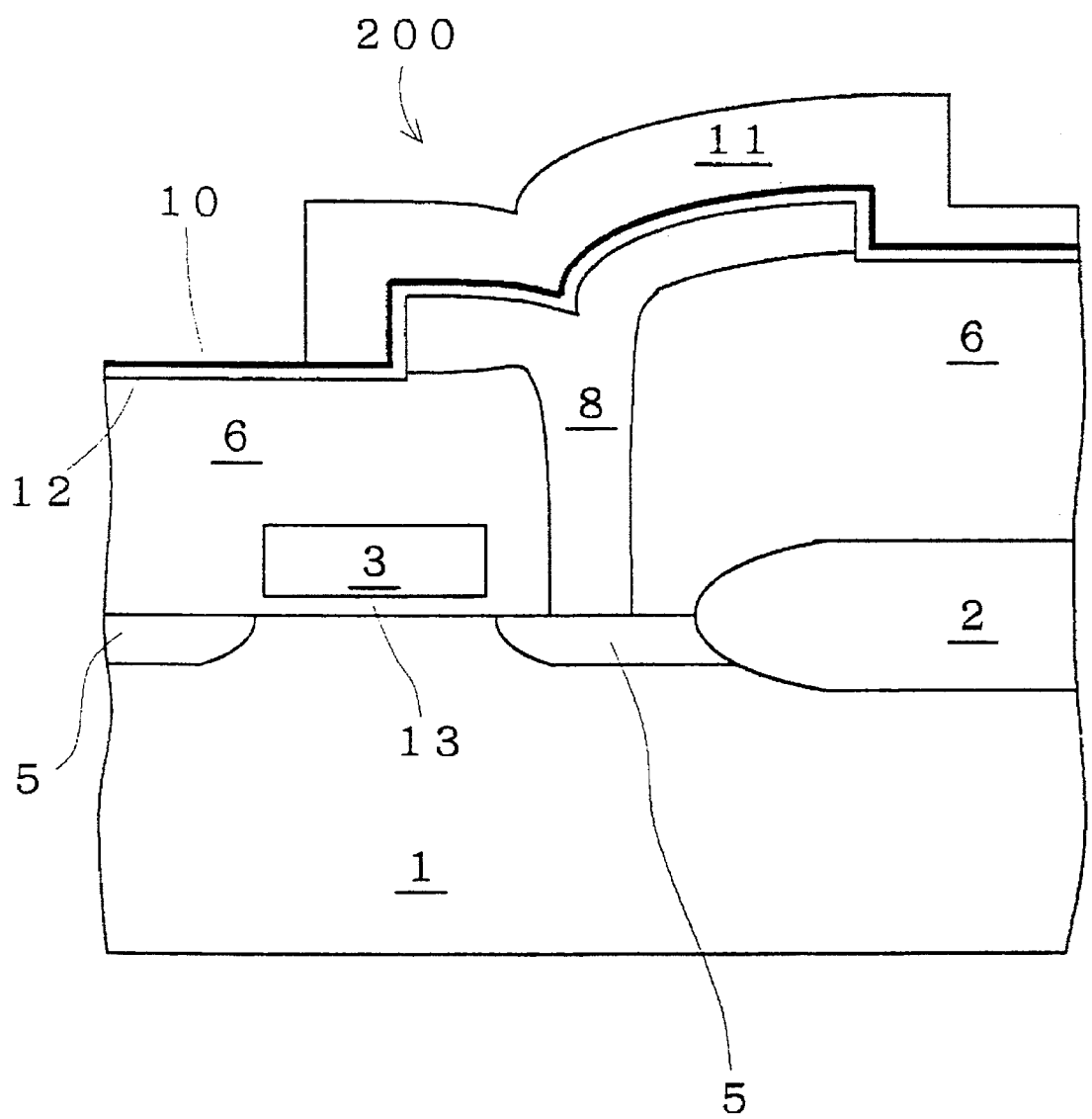
FIG. 1 is a sectional view showing a first preferred embodiment of the present invention.

FIG. 1 is a sectional view of a structure of semiconductor device which is manufactured by using a method of forming a silicon nitride film in accordance with the first preferred embodiment of the present invention. As compared with the background-art semiconductor device, the capacitor 100 is replaced with a capacitor 200. In the capacitor 200, a silicon nitride film 12 is formed instead of the silicon nitride film 9 of the capacitor 100. The silicon nitride film 12 is formed under optimized conditions. The first preferred embodiment shows a technique for optimization of conditions under which the silicon nitride film is formed.

Figure 8:
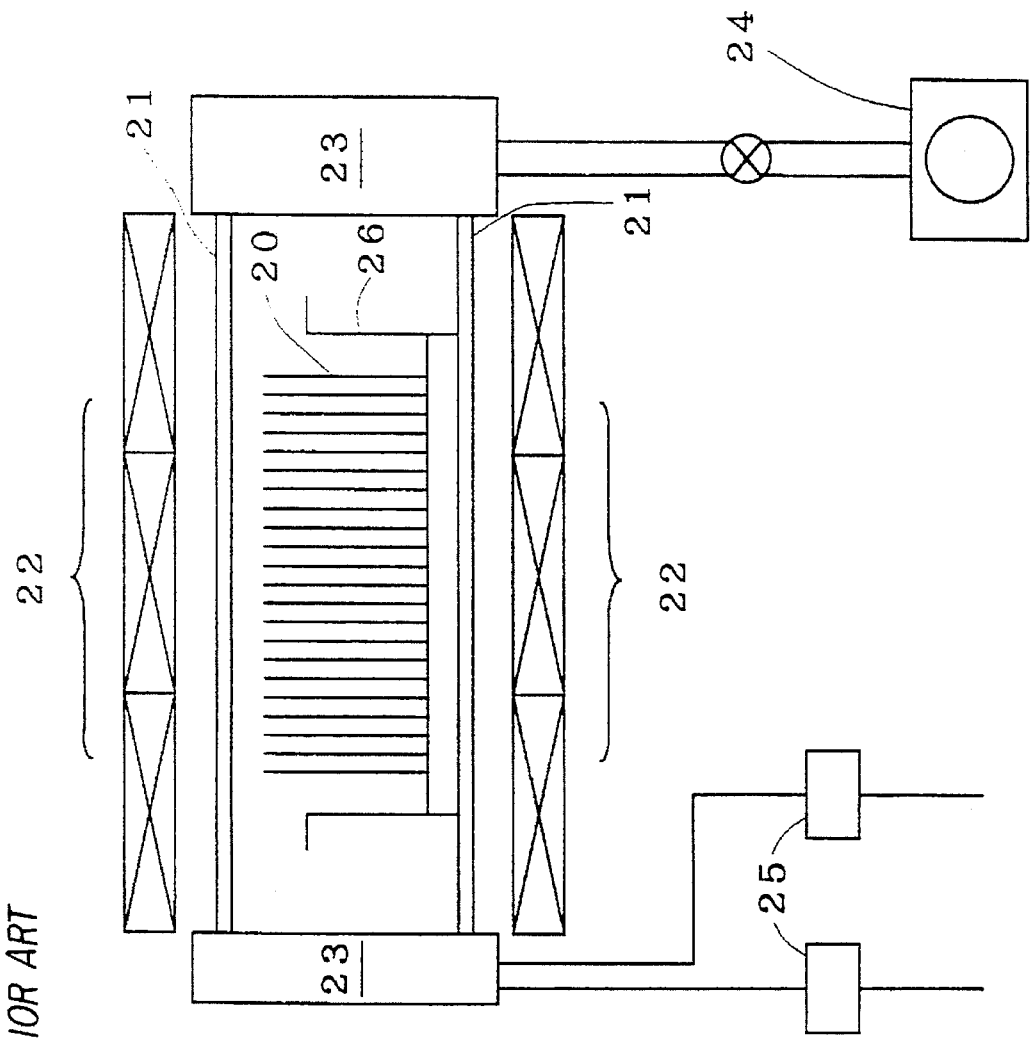

The silicon nitride film 12 is formed by the device of FIG. 8, and specifically, formed by the batch-type low pressure CVD method. Dichlorosilane ($SiH_2Cl_2$) and ammonia ($NH_3$) are used as source gas for forming the silicon nitride film in the same manner as the background art. The first preferred embodiment uses, for example, hydrogen ($H_2$), nitrogen ($N_2$), helium (He) and argon (Ar) as carrier gas to achieve the pressure (total pressure) inside a chamber as discussed later.

A marked difference between the first preferred embodiment and the background art lies in the setting of a pressure (total pressure) of the chamber to about 100 to 300 Torr ($1.33 \times 10^4$ to $4.00 \times 10^4$ Pa). In this case, because of sufficiently large volume flow rate of the carrier gas to dichlorosilane, from 100 to 500, a partial pressure of the source gas is suppressed to about 1 Torr or less even when the pressure (total pressure) inside the chamber is in the range of 100 to 300 Torr. The volume flow rate of ammonia to dichlorosilane is set to the range of 3 to 10. For example, dichlorosilane, ammonia and hydrogen are set to 60 SCCM, 300 SCCM and 20 SLM, respectively. Furthermore, the silicon nitride film is formed at a practical deposition speed by heating it to 650° C. to 750° C.

The sufficiently large pressure (total pressure) inside the chamber, ranging from 100 to 300 Torr ($1.33 \times 10^4$ to $4.00 \times 10^4$ Pa), allows improvement in a masking effect of the silicon nitride film for preventing oxidation. Even if the silicon nitride film 12 is much thinner, the oxidizing agent is kept from going through the silicon nitride film 12 to oxidize the capacitor accumulation electrode 8 of polysilicon.

Figure 2:
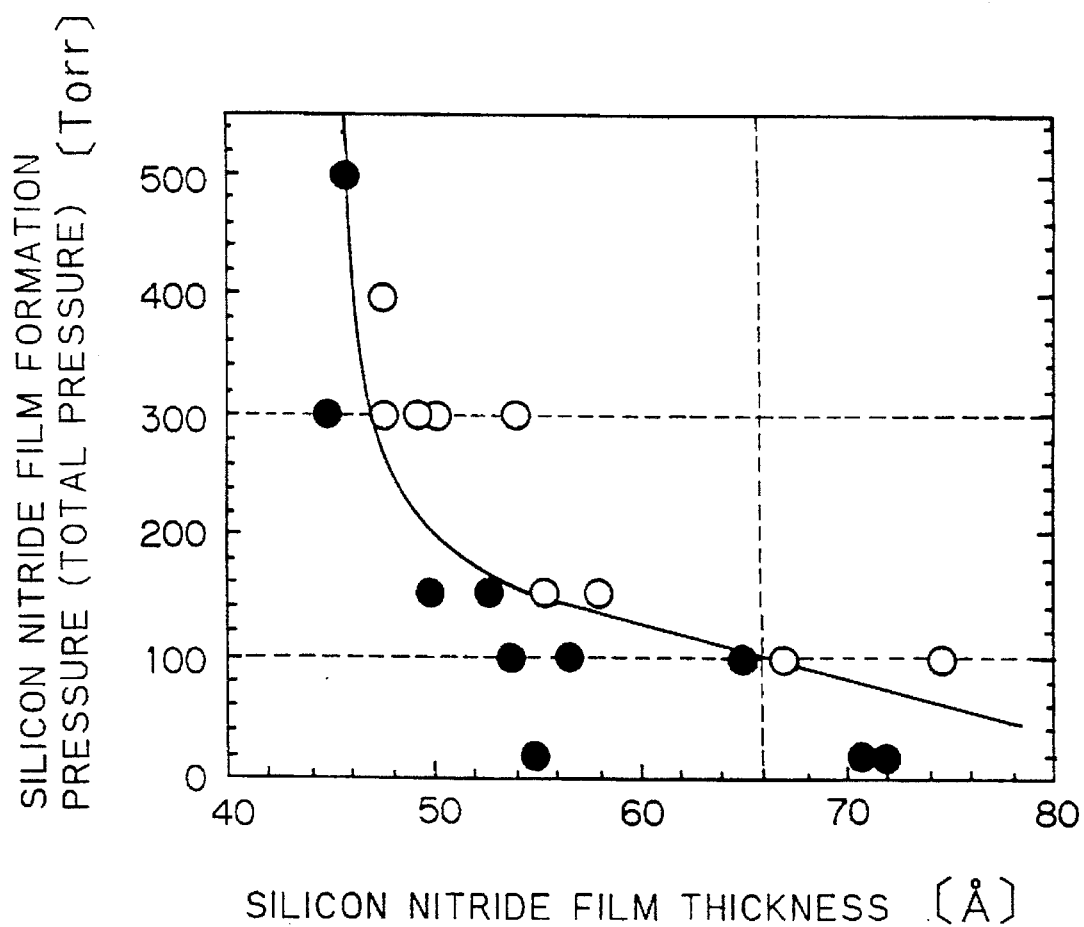
FIGS. 2 and 3 are graphs showing an effect of the first preferred embodiment of the present invention.

FIG. 2 is a graph showing the relation between the pressure (total pressure) of the chamber when the silicon nitride film 12 is formed and the thickness of the silicon nitride film 12 required for mask tolerance to prevent the capacitor accumulation electrode 8 from oxidization. This graph shows the film thickness of the silicon nitride film 12 formed on the capacitor accumulation electrode 8. The film thickness of the silicon nitride film 12 formed on the interlayer oxide film 6 is thinner than that shown in the graph, and is more problematic in terms of mask tolerance.

In this graph, a blank circle represents a case where masking effect is exerted and a solid circle represents a case where no masking effect is exerted. Since it is obvious that the masking effect becomes less as the silicon nitride film 12 becomes thinner, a film thickness thicker than that indicated by the blank circle produces a good masking effect and a film thickness thinner than that indicated by the solid circle produces a bad masking effect under the same pressure (total pressure) of the chamber. The curve represents a border of excellency in masking effect. Therefore, when the silicon nitride film 12, the thickness of which is shown in the left region of the curve, is formed on the capacitor accumulation electrode 8, the silicon nitride film 12 concurrently formed on the interlayer oxide film 6 never produces a good masking effect.

In the recent integration, e.g., of 64M DRAM class, specifications required about a capacitor are that the capacitance of a capacitor is about 25 fF and the effective area of the capacitor accumulation electrode 8 is 2.5 $\mu m^2$ per unit of cell. Considering that the dielectric constant of the silicon nitride film is about 7.4, the required thickness of the silicon nitride film 12 is 66 angstrom (Å) or less. With respect to this thickness, the pressure of the chamber should be 100 Torr ($1.33 \times 10^4$ Pa) or more to achieve a masking effect.

Figure 3:
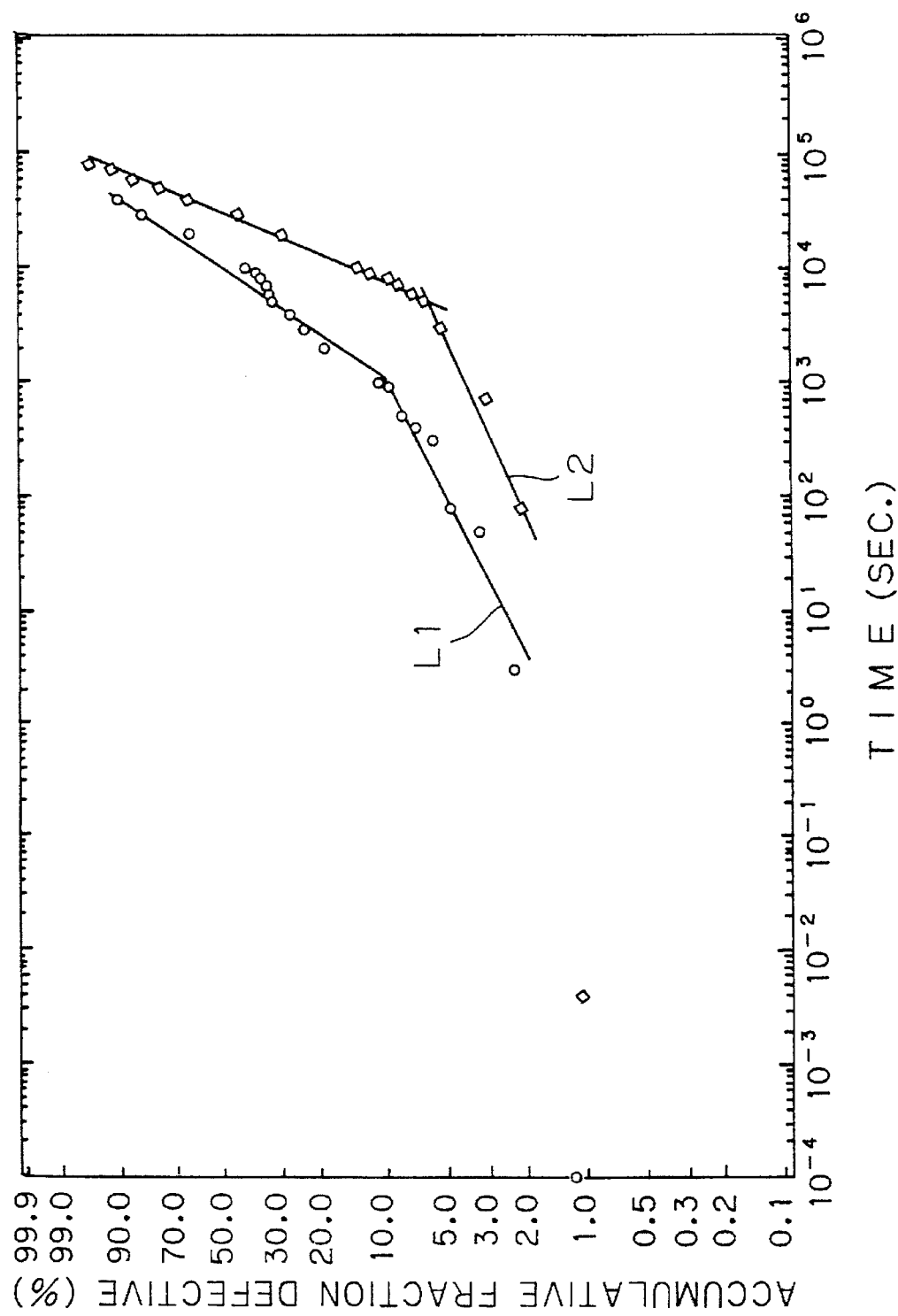

FIG. 3 is a Weibull plot showing the relation between the pressure (total pressure) of the chamber when the silicon nitride film 12 is formed and the cumulative fraction defective in a constant voltage stress test. It can be seen from this graph, as the pressure (total pressure) of the chamber increases, time-varying dielectric breakdown lifetime becomes longer.

When the pressure of the chamber is over 300 Torr ($4.00 \times 10^4$ Pa), the film thickness to ensure the masking effect little decreases. Furthermore, the speed of forming a silicon nitride film is high when the pressure is over 300 Torr ($4.00 \times 10^4$ Pa), and accordingly, it becomes difficult to control the film thickness. Therefore, it is found desirable that the pressure inside the chamber should be from 100 to 300 Torr ($1.33 \times 10^4$ to $4.00 \times 10^4$ Pa).

Thus, the first preferred embodiment achieves optimization of the conditions under which the silicon nitride film is formed, to obtain a stacked capacitor with high reliability. In consequence, a semiconductor device which causes no degradation of reliability even when refined can be provided.

The Second Preferred Embodiment

As the oxide film formed between the capacitor accumulation electrode 8 and the silicon nitride film 12 in the stacked capacitor becomes thinner, the time-varying dielectric breakdown lifetime becomes longer. That is shown in "Dielectric Breakdown and Current Conduction of Oxide/Nitride/Oxide Multi-Layer Structures" (K. Kobayashi et at., J. Electrochem. Soc., Vol. 139, No. 6, June 1992). In this document, however, the above tendency is discussed in a case where the thickness of the oxide film is formed thick and no method of removing the oxide film is discussed. The second preferred embodiment shows a process of removing the oxide film.

Prior to deposition of the silicon nitride film 12, a heat treatment of the silicon substrate is performed in hydrogen ($H_2$) atmosphere or silane ($SiH_4$) or disilane ($Si_2H_6$) atmosphere of very low concentration, to remove a natural oxide film on a surface of the capacitor accumulation electrode 8.

The partial pressure of silane or disilane in the pressure of the chamber is controlled to about $10^{-6}$ to $10^{-4}$ Torr ($1.33 \times 10^{-4}$ to $1.33 \times 10^{-2}$ Pa) and consequently the natural oxide film is removed through a reduction reaction. The desirable temperature in performing the heat treatment is 850° C. or more in hydrogen ($H_2$) atmosphere, and about 700° C. to 850° C. in silane ($SiH_4$) or disilane ($Si_2H_6$) atmosphere with carrier gas.

After removing the natural oxide film formed on the capacitor accumulation electrode 8, the silicon nitride film 12 is subsequently formed by the method of the first preferred embodiment in the same chamber without atmospheric exposure.

Figure 4:
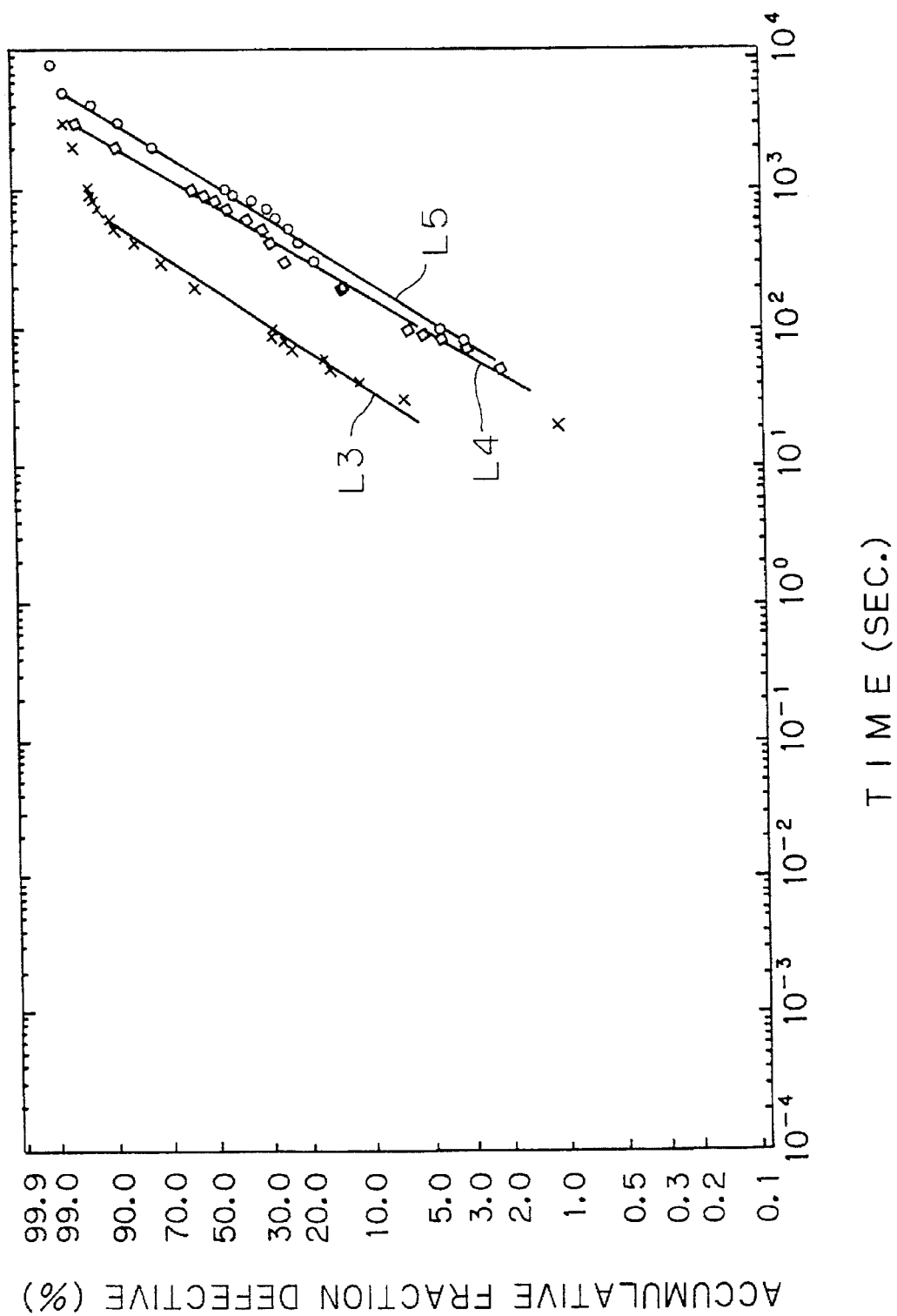
FIG. 4 is a graph showing an effect of a second preferred embodiment of the present invention.

FIG. 4 is a Weibull plot showing a result of a constant voltage stress test where the natural oxide film is removed in hydrogen atmosphere and subsequently the silicon nitride film is formed to obtain a stacked capacitor. This graph clearly shows the removal of the natural oxide film in hydrogen atmosphere allows improvement in time-varying dielectric breakdown lifetime. The same is found as to the removal of the natural oxide film in silane or disilane atmosphere of very low concentration.

Thus, a high reliable structure of stacked capacitor in which a silicon nitride film is formed can be achieved. As a result, a semiconductor device which causes no degradation of reliability even when refined can be provided.

The Third Preferred Embodiment

Figure 5:
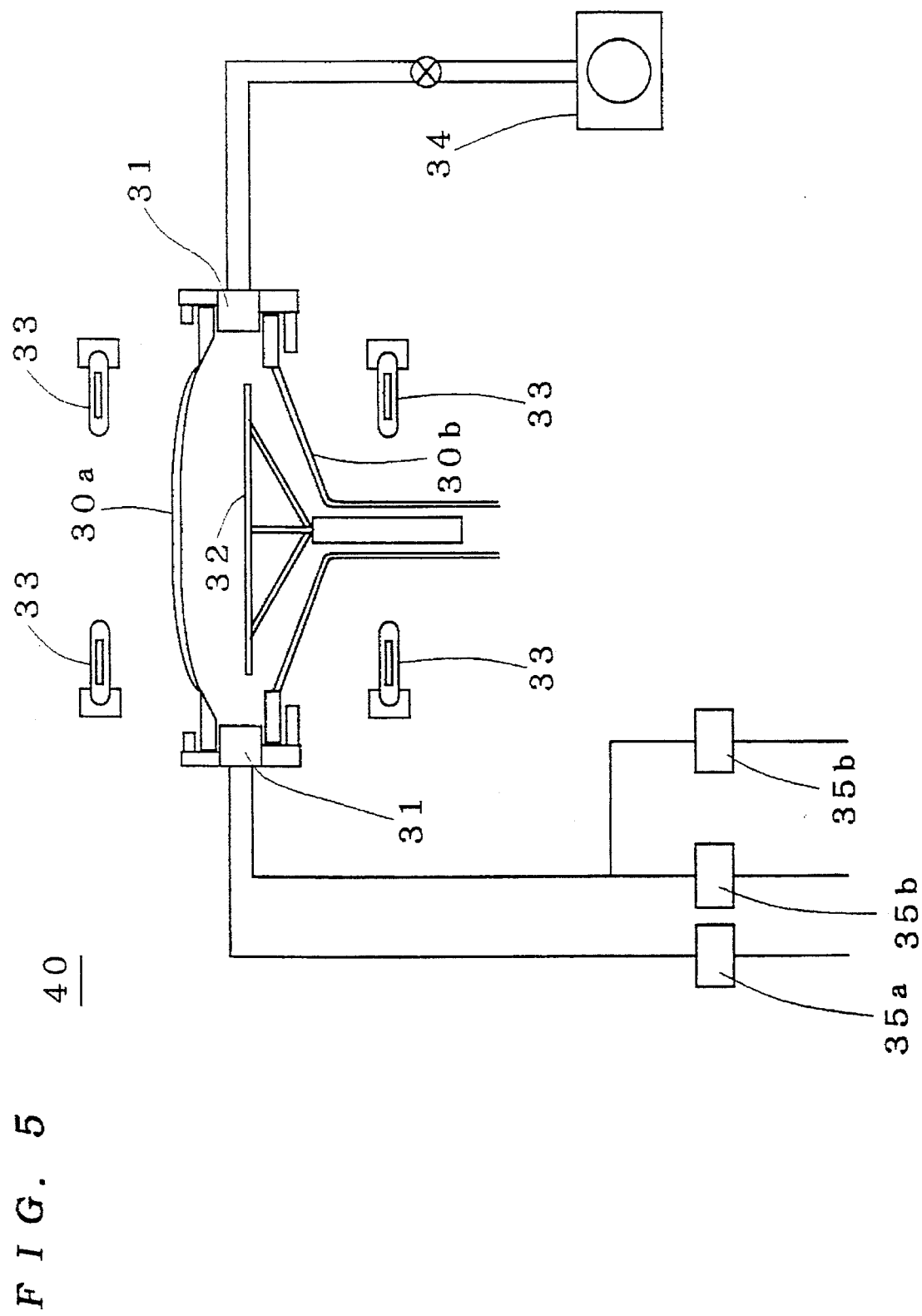
FIG. 5 is a sectional view showing a third preferred embodiment of the present invention.
Figure 6:
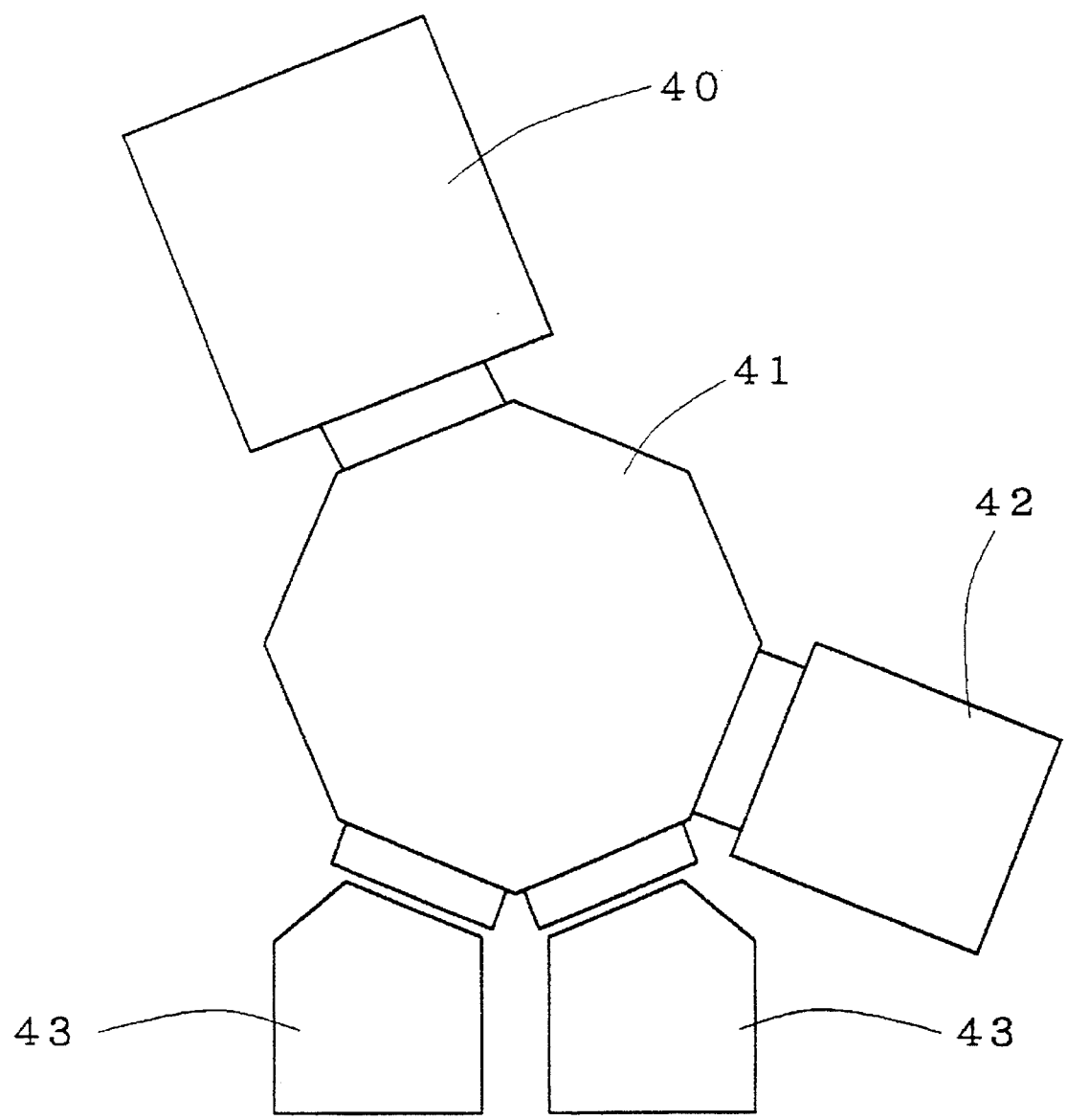
FIG. 6 is a plan view showing a third preferred embodiment of the present invention.
Figure 7:
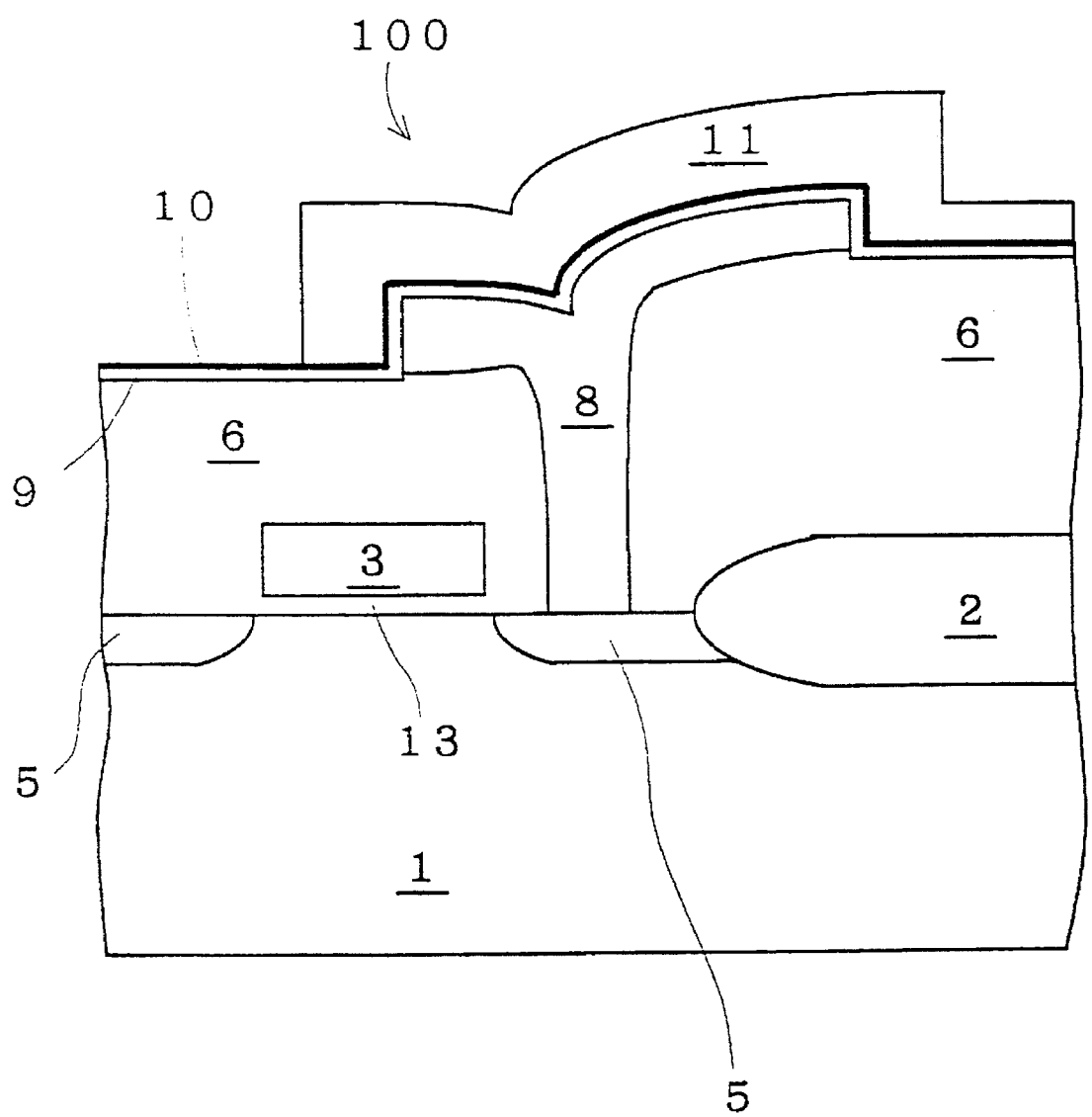
FIGS. 7 and 8 are sectional views showing a background art.

The third preferred embodiment shows a sheet-fed type apparatus for implementing the method of forming the silicon nitride film in accordance with the first preferred embodiment. FIG. 5 is a sectional view of a film formation chamber 40 used for forming a silicon nitride film by the low pressure CVD method in accordance with the third preferred embodiment. FIG. 6 is a plan view schematically showing the sheet-fed type apparatus which includes the film formation chamber 40.

In FIG. 6, the film formation chamber 40, a cooling chamber 42 and load lock chambers 43 are provided around a transport chamber 41. In FIG. 5, quartz chambers 30a and 30b are fixed with a metal bases 31, and a space surrounded by the quartz chambers 30a and 30b is vacuum-sealed with the metal bases 31.

A susceptor 32 supports a silicon substrate (not shown). A vacuum pump 34 evacuates the space surrounded by the quartz chambers 30a and 30b, and a lump 33 heats the silicon substrate. Mass flow controllers 35a and 35b control gas flow into the space surrounded by the quartz 30a and 30b.

At first, the space surrounded by the quartz chambers 30a and 30b is evacuated by the vacuum pump 34 into a vacuum. Only one silicon substrate is loaded from the load lock chamber 43 through the transport chamber 41 into the space surrounded by the quartz chambers 30a and 30b in a vacuum. The silicon substrate gets supported on the susceptor 32, and then the susceptor 32 rotates. The lump 33 heats the silicon substrate and the susceptor 32 by radiant. After the silicon substrate is controlled to a prescribed temperature, the mass flow controllers 35b feed dichlorosilane and ammonia as source gas and the mass flow controller 35a feeds, for example, argon as carrier gas to the space surrounded by the quartz chambers 30a and 30b, while controlling gas flow.

After that, the silicon nitride film is formed by chemical vapor reaction in such a manner as shown in the first preferred embodiment. After the formation of the silicon nitride film, the silicon substrate is unloaded from the space surrounded by the quartz chambers 30a and 30b. The next silicon substrate is subsequently loaded into the space surrounded by the quarts chambers 30a and 30b, and the silicon nitride film is formed in the same manner.

Thus, the apparatus for forming a silicon nitride film by the low pressure CVD method in accordance with the present invention enables sequential and successive formation of silicon nitride film on a silicon substrate. Moreover, the apparatus allows only one silicon substrate to be processed at a time, in contrast with the background-art batch low pressure CVD method, and accordingly it becomes possible to reduce the capacity of the chamber. Therefore, improvements in controllability of process conditions under which the silicon nitride film is formed as discussed in the first preferred embodiment and in uniformity of deposition of the silicon nitride film can be achieved.

While the invention has been shown and described in detail, the foregoing description is in all aspects illustrative and not restrictive. It is therefore understood that numerous modifications and variations can be devised without departing the scope of the invention.

We claim:

1. A method of forming a silicon nitride film by low pressure chemical vapor deposition, comprising the steps of:
   (a) introducing a substrate of a silicon film having a silicon oxide film surrounding the silicon film in an upper portion of the substrate into a reaction container;
   (b) evacuating said reaction container; and
   (c) introducing a source gas comprising dichlorosilane and ammonia and a carrier gas into said reaction container while maintaining the pressure of gas within said reaction container from $2.00 \times 10^4$ Pa to $4.00 \times 10^4$ Pa, thereby depositing said silicon nitride film at a thickness of about 58 Å to about 48 Å.

2. The method of claim 1, wherein the carrier gas and dichlorosilane are introduced into said reaction container at a volume flow ratio of carrier gas to dichlorosilane ranging from 100 to 500.

3. The method of claim 2, wherein the ammonia and dichlorosilane are introduced into said reaction container at a volume flow ratio of ammonia to dichlorosilane ranging from 3 to 10.

4. The method of claim 3, wherein the volume flow ratio of said ammonia to said dichlorosilane is achieved by a flow volume of ammonia of 300 SCCM and a flow volume of dichlorosilane of 60 SCCM.

5. The method of claim 4, wherein said substrate is heated to a temperature within the range of 650° C. to 750° C.

6. The method of claim 5, wherein said carrier gas is at least one gas selected from the group consisting of hydrogen, nitrogen, helium and argon.

7. The method of claim 1, further comprising a step of (d) performing a reduction reaction on said substrate which reduces a natural oxide film on said substrate placed into said reaction container after step (b), but before step (c).

8. The method of claim 7, wherein said step (d) comprises the steps of:
   (d-1) introducing a reducing gas into said reaction container to remove said natural oxide film on said substrate; and
   (d-2) heating said substrate.

9. The method of claim 8, wherein said reducing gas comprises at least one gas selected from the group consisting of silane and disilane and wherein the partial pressure thereof ranges from $1.33 \times 10^{-4}$ to $1.33 \times 10^{-2}$ Pa.

10. The method of claim 9, wherein said substrate is heated to a temperature within the range of 700° C. to 850° C. in step (d-2).

11. The method of claim 8, wherein said reducing gas comprises hydrogen.

12. The method of claim 11, wherein said substrate is heated to a temperature of at least 850° C. in step (d-2).

13. A method of forming a stacked capacitor, comprising the steps of:
   (a) preparing a substrate of a silicon film having a silicon oxide film surrounding said silicon film in an upper portion of said substrate;
   (b) coating a silicon nitride film on the silicon oxide film on said silicon film by low pressure chemical vapor deposition;
   (c) oxidizing a surface of said silicon nitride film to form an oxide film; and
   (d) providing an electrode on said film,
   wherein said step (b) comprises the steps of:
   (b-1) introducing said substrate into a reaction container;
   (b-2) evacuating said reaction container; and
   (b-3) introducing a source gas comprising dichlorosilane and ammonia and a carrier gas into said reaction container while maintaining the pressure of gas within the reaction container to within the range of $2.00 \times 10^4$ to $4.00 \times 10^4$ Pa at which said silicon nitride film is prepared at a thickness ranging from about 58 Å to about 48 Å.

* * * * *